(12) United States Patent
Guettinger et al.

(10) Patent No.: US 12,146,895 B2
(45) Date of Patent: Nov. 19, 2024

(54) ROBUST SIGNAL PATH PLAUSIBILITY CHECK FOR FUNCTIONAL SAFETY OF A SENSOR

(71) Applicant: Infineon Technologies AG, Neubiberg (DE)

(72) Inventors: Johannes Guettinger, Lind ob Velden (AT); Bernhard Forster, Finkenstein (AT); Simon Hainz, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1002 days.

(21) Appl. No.: 17/064,195

(22) Filed: Oct. 6, 2020

(65) Prior Publication Data
US 2022/0107338 A1 Apr. 7, 2022

(51) Int. Cl.
| | | |
|---|---|---|
| G01P 21/02 | (2006.01) | |
| G01P 3/44 | (2006.01) | |
| G01R 29/08 | (2006.01) | |
| G01R 31/28 | (2006.01) | |
| G01R 33/00 | (2006.01) | |
| G01R 35/00 | (2006.01) | |

(52) U.S. Cl.
CPC ............ *G01P 21/02* (2013.01); *G01P 3/44* (2013.01); *G01R 29/0878* (2013.01); *G01R 31/2829* (2013.01); *G01R 33/0029* (2013.01); *G01R 35/00* (2013.01); *G01R 33/0041* (2013.01)

(58) Field of Classification Search
CPC . G01P 21/02; G01P 3/44; G01P 3/488; G01R 29/0878; G01R 31/2829; G01R 33/0029; G01R 33/0041; G01R 35/00
See application file for complete search history.

(56) References Cited

U.S. PATENT DOCUMENTS

| | | |
|---|---|---|
| 6,822,597 B2 | 11/2004 | Draxelmayr |
| 9,678,138 B2 | 6/2017 | Forster et al. |
| 2016/0116497 A1* | 4/2016 | Forster .................. G01D 5/248 340/670 |

(Continued)

FOREIGN PATENT DOCUMENTS

DE 102012015945 A1 * 5/2014 ............... H03K 5/24

*Primary Examiner* — Neel D Shah
*Assistant Examiner* — Adam S Clarke
(74) *Attorney, Agent, or Firm* — Harrity & Harrity, LLP

(57) ABSTRACT

A monitoring device of a sensor may obtain a first signal at a point on a first branch of a signal path of the sensor. The monitoring device may obtain a second signal at a point on a second branch of the signal path of the sensor and may monitor the first signal for first characteristics indicated by the first signal. The monitoring device may monitor the second signal for second characteristics indicated by the second signal. The monitoring device may determine whether a quantity of first characteristics indicated by the first signal without a particular quantity of second characteristics being indicated by the second signal reaches a threshold quantity of first characteristics. The monitoring device may assess functionality of the signal path based on whether the quantity of first characteristics indicated by the first signal without a particular quantity of second characteristics being indicated by the second signal reaches the threshold quantity of first characteristics.

20 Claims, 6 Drawing Sheets

(56) References Cited

U.S. PATENT DOCUMENTS

| 2016/0131696 A1* | 5/2016 | Forster | G01R 31/007 |
| | | | 327/1 |
| 2018/0365974 A1* | 12/2018 | Haas | G01R 33/07 |
| 2019/0072416 A1* | 3/2019 | Hainz | G01D 5/24457 |
| 2021/0247213 A1* | 8/2021 | Metivier | G01D 5/2451 |

\* cited by examiner

ROBUST SIGNAL PATH PLAUSIBILITY CHECK FOR FUNCTIONAL SAFETY OF A SENSOR

BACKGROUND

A magnetic sensor may sense a magnetic field produced or distorted by a rotating target wheel, such as a tooth wheel, an encoder wheel, and/or the like. The magnetic sensor may output, based on the sensed magnetic field, a signal for use in identifying a rotational direction of the target wheel, a rotational speed of the target wheel, a rotational angle of the target wheel, and/or the like.

SUMMARY

In some implementations, a method includes obtaining, by a monitoring device of a sensor, a first signal at a point on a first branch of a signal path of the sensor; obtaining, by the monitoring device, a second signal at a point on a second branch of the signal path of the sensor; monitoring, by the monitoring device, the first signal for first characteristics indicated by the first signal; monitoring, by the monitoring device, the second signal for second characteristics indicated by the second signal; determining, by the monitoring device and based on the monitoring of the first signal for first characteristics and the monitoring of the second signal for second characteristics, whether a quantity of first characteristics indicated by the first signal without a particular quantity of second characteristics being indicated by the second signal reaches a threshold quantity of first characteristics; and assessing, by the monitoring device, functionality of the signal path based on whether the quantity of first characteristics indicated by the first signal without a particular quantity of second characteristics being indicated by the second signal reaches the threshold quantity of first characteristics.

In some implementations, a sensor includes a signal path including a first branch and a second branch; and a monitoring device to: obtain a first signal at a point on the first branch of the signal path; obtain a second signal at a point on the second branch of the signal path; monitor the first signal for first characteristics indicated by the first signal; monitor the second signal for second characteristics indicated by the second signal; determine, based on the monitoring of the first signal for first characteristics and the monitoring of the second signal for second characteristics, whether a quantity of first characteristics indicated by the first signal without a particular quantity of second characteristics being indicated by the second signal reaches a threshold quantity of first characteristics; and assess functionality of the signal path based on whether the quantity of first characteristics indicated by the first signal without a particular quantity of second characteristics being indicated by the second signal reaches the threshold quantity of first characteristics.

In some implementations, a monitoring device includes one or more components to monitor an analog signal for analog characteristics indicated by the analog signal, the analog signal being associated with an analog branch of a signal path of a sensor; monitor a digital signal for digital characteristics indicated by the digital signal, the digital signal being associated with a digital branch of the signal path of the sensor and being a digital representation of the analog signal; and assess functionality of the signal path based on the monitoring of the analog signal and the monitoring of the digital signal, the assessing of the functionality being based on at least one of: a determination of whether a quantity of analog characteristics indicated by the analog signal without a particular quantity of digital characteristics being indicated by the digital signal reaches a threshold quantity of analog characteristics, or a determination whether a quantity of digital characteristics indicated by the digital signal without a particular quantity of analog characteristics being indicated by the analog signal reaches a threshold quantity of digital characteristics.

DETAILED DESCRIPTION

Figure 1A:
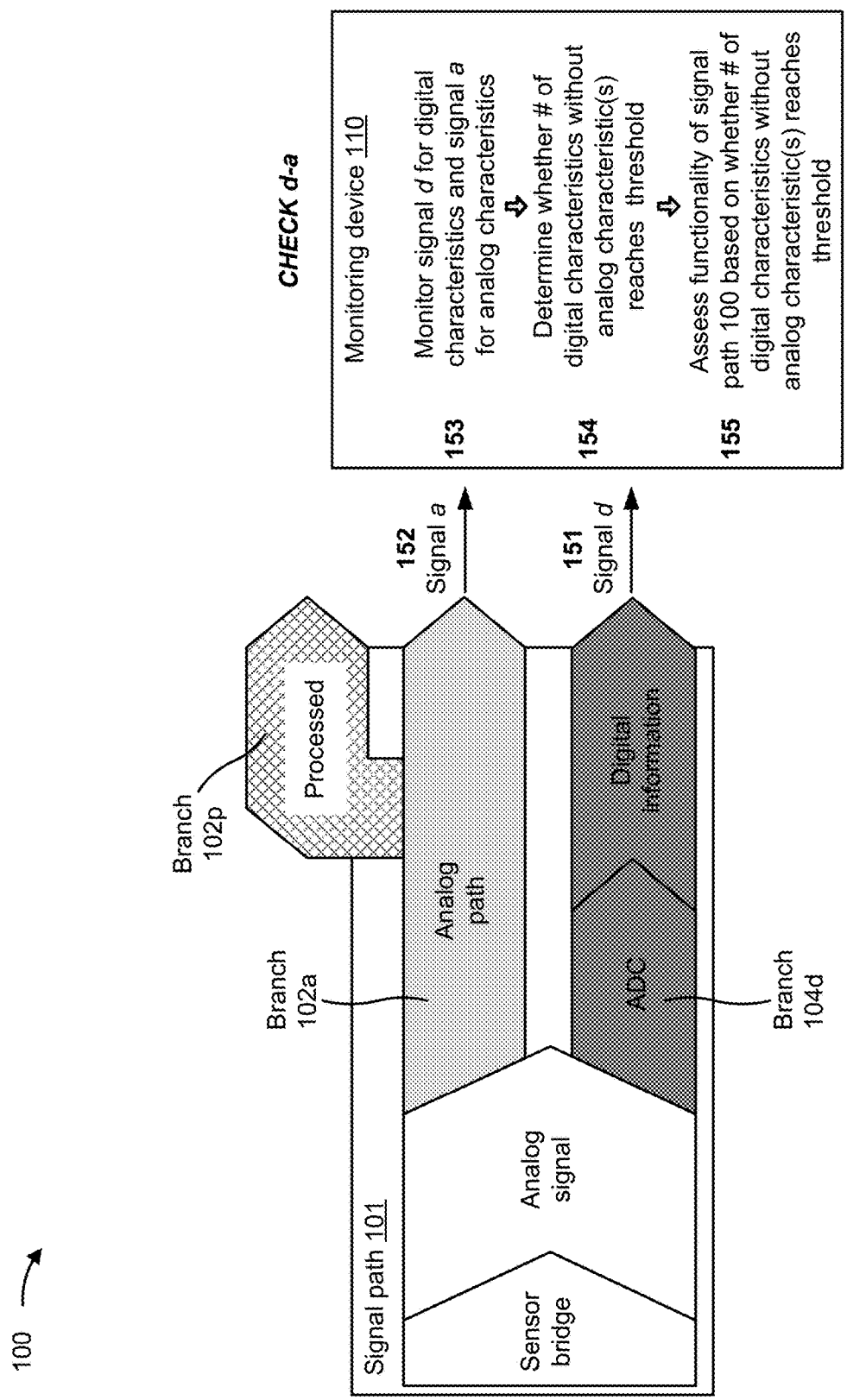
FIGS. 1A and 1B are diagrams illustrating example implementations of robust signal path plausibility checking for functional safety of a sensor.

The following detailed description of example implementations refers to the accompanying drawings. The same reference numbers in different drawings may identify the same or similar elements.

A magnetic sensor may be designed to sense a magnetic field and output a signal for use in identifying a rotational direction of a target wheel, a rotational speed of the target wheel, a rotational angle of the target wheel, and/or the like, as described above. In some applications, it may be necessary to ensure functional safety of the magnetic sensor. In general, functional safety can be defined as an absence of unreasonable risk (e.g., to a system, to an environment, to people, and/or the like) due to hazards caused by malfunctioning behavior (e.g., a systematic failure, a random failure, or the like) of the magnetic sensor.

In the automotive context, an Automotive Safety Integrity Level (ASIL) scheme may be used to dictate functional safety requirements for a magnetic sensor. The ASIL scheme is a risk classification scheme defined by the International Organization for Standardization (ISO) 26262 standard (titled Functional Safety for Road Vehicles), which provides a standard for functional safety of electrical and/or electronic systems in production automobiles. An ASIL classification defines safety requirements necessary to be in line with the ISO 26262 standard. An ASIL is established by performing a risk analysis of a potential hazard by looking at severity, exposure, and controllability of a vehicle operating scenario. A safety goal for that hazard in turn carries the ASIL requirements. There are four ASILs identified by the standard: ASIL A, ASIL B, ASIL C, ASIL D. ASIL D dictates the highest integrity requirements, while ASIL A dictates the lowest. A hazard with a risk that is low (and, therefore, does not require safety measures in accordance with ISO 26262) is identified as quality management (QM). In some cases, a magnetic sensor designed to sense a magnetic field and output a signal for use in identifying a rotational direction, speed, and/or angle of a target wheel may require a particular ASIL, such as ASIL B. To ensure functional safety in such a magnetic sensor, a safety mechanism that allows lack of sensor functionality to be identified and signaled should be implemented.

One possible technique for providing functional safety in a magnetic sensor is to duplicate functional elements of the magnetic sensor such that a fully redundant signal path is provided (which allows comparison of outputs from the redundant signal paths to identify an error). However, providing full redundancy of the signal path is expensive due to, for example, additional chip area required and overhead complexity, and in any case may not be needed Furthermore, overall availability of the magnetic sensor is reduced because of the increased possibility of a signal path error as a result of two signal paths being included in the magnetic sensor.

Another possible technique is to implement a monitoring mechanism to monitor functionality of a signal path in a magnetic sensor. One type of monitoring mechanism to monitor functionality of a signal path is a timeout monitor. The timeout monitor operates to reset a magnetic sensor if no output is generated within a specified period of time. However, with such a timeout monitor, standstill functionality of the target wheel (i.e., zero Hertz (Hz) capability) is not reachable because a standstill of the target wheel would result in a false positive error detection. Therefore, the timeout monitor needs to be coupled to an external safety mechanism (e.g., at an electronic control unit (ECU)) to accurately detect sensor chip faults.

Another type of monitoring mechanism to monitor functionality of a signal path is a signal monitor. One implementation of a signal monitor obtains a first signal and second signal from different points on the same signal path, where the second signal is related to the first signal, such as a processed version of the first signal. Here, the signal monitor identifies a first characteristic (e.g., a zero crossing) in the first signal and then checks whether a corresponding second characteristic, consistent with the first characteristic, is present in the second signal. That is, the signal monitor evaluates whether an expected interrelation between the first and second signals can be confirmed by assessing whether a characteristic of the first signal (e.g., a slope of a rising edge at a zero crossing of the first signal) is represented in the second signal. If the signal monitor does not find the second characteristic in the second signal (i.e., that the first characteristic is not represented in the second signal), then the signal monitor signals a warning or a failure associated with the signal path.

Another implementation of a signal monitor crosschecks information received on different signal paths of the magnetic sensor, such as a speed signal path of the magnetic sensor (e.g., a signal path that provides a signal based on which a rotational speed can be determined) and a direction signal path of the magnetic sensor (e.g., a signal path that provides a signal based on which a rotational direction can be determined). Here, the speed signal and the direction signal are expected to have a predefined relationship with respect to one another, such as a 90 degree (°) phase difference. The monitoring mechanism obtains the speed signal and the direction signal and determines whether the predefined relationship holds between the signals obtained from the different signal paths. If the monitoring mechanism finds that the predefined relationship has been violated, based on comparing the speed signal and the direction signal, then the monitoring mechanism signals a warning or a failure indicating that the speed signal and/or the direction signal are not reliable.

Notably, the above-described implementations of signal monitors perform acceptably in an application in which abrupt changes in rotational direction cannot occur and in which little or no vibration of the target wheel is present. However, these signal monitors do not perform well in the presence of abrupt rotational direction changes and are not robust against vibration. Vibrations may be common in some applications, such as a transmission application (e.g., when the target wheel is not to be locked into a gear). A vibration in this context includes an angular vibration (e.g., rapidly occurring, repeated changes of rotational direction of the target wheel) and/or an air gap vibration (e.g., rapidly occurring, repeated change in size of the air gap between the target wheel and the sensor chip). A vibration can significantly impact one or more characteristics of a sensor signal. For example, when a magnetic sensor includes a speed signal path and a direction signal path, an angular vibration causes phase shifts on the speed and direction signals and, as result of these phase shifts, also causes amplitude changes in the speed and direction signals. Here, an air gap vibration causes changes in amplitude of the speed signal and/or the direction signal. A degree to which a given signal is impacted depends on an angular position of the target wheel during the vibration. For example, a vibration occurring near an extremum (e.g., a maximum or a minimum) of the speed signal and a zero crossing of the direction signal may cause phase shifts that result in the speed signal having a relatively small amplitude and the direction signal having a relatively larger amplitude. As another example, a vibration occurring near an extremum of the direction signal and a zero crossing of the speed signal may cause phase shifts that result in the speed signal having a relatively large amplitude and the direction signal having a relatively small amplitude.

In such vibration cases, there is a high probability that the above-described signal monitor implementations would signal a false positive error on the signal path. These false positives result in low availability of the magnetic sensor, which is not acceptable, particular in an application in which vibrations regularly occur (e.g., a transmission application).

Some aspects described herein provide techniques and apparatuses for a robust signal path plausibility check for ensuring functional safety of a magnetic sensor. In some implementations, a monitoring device of a sensor may obtain a first signal at a point on the first branch of the signal path and may obtain a second signal at a point on the second branch of the signal path. The monitoring device may monitor the first signal for first characteristics indicated by the first signal and may monitor the second signal for second characteristics indicated by the second signal. The monitoring device may determine, based on the monitoring of the first signal for first characteristics and the monitoring of the second signal for second characteristics, whether a quantity of first characteristics indicated by the first signal without a particular quantity of second characteristics (e.g., one or more second characteristics) being indicated by the second signal reaches a threshold quantity of first characteristics. The monitoring device may then assess functionality of the signal path based on whether the quantity of first characteristics indicated by the first signal without a particular quantity of second characteristics being indicated by the second signal reaches the threshold quantity of first characteristics. Additional details are provided below.

In some implementations, the techniques and apparatuses described herein utilize inherent redundancy in a single signal path of the magnetic sensor to significantly increase functional safety, without a need for adding expensive redundant functionality. As a result, functionality of the magnetic sensor can be assessed, and because the signals are associated with the same signal path, the assessment of the functional safety of the magnetic sensor will be independent of a signal frequency and external vibrations. Notably, the techniques and apparatuses described herein provide significant coverage of the signal path (e.g., a portion of the signal path after an analog bridge, which may be approximately 75% of the signal path). Further, the techniques and apparatuses described herein are compatible with standstill functionality, meaning that the magnetic sensor need not be coupled to an external safety mechanism in association with assessing functional safety. Additionally, the techniques and apparatuses described herein are robust against vibration, meaning that a likelihood of a false positive error indication is reduced or eliminated, thereby increasing availability of the magnetic sensor (e.g., as compared to a sensor configured with any of the signal monitor implementations described above). In general, the techniques and apparatuses described herein improve functional safety of the magnetic sensor with a relatively small and inexpensive amount of additional circuitry, without compromising functionality of the magnetic sensor.

Figure 1B:
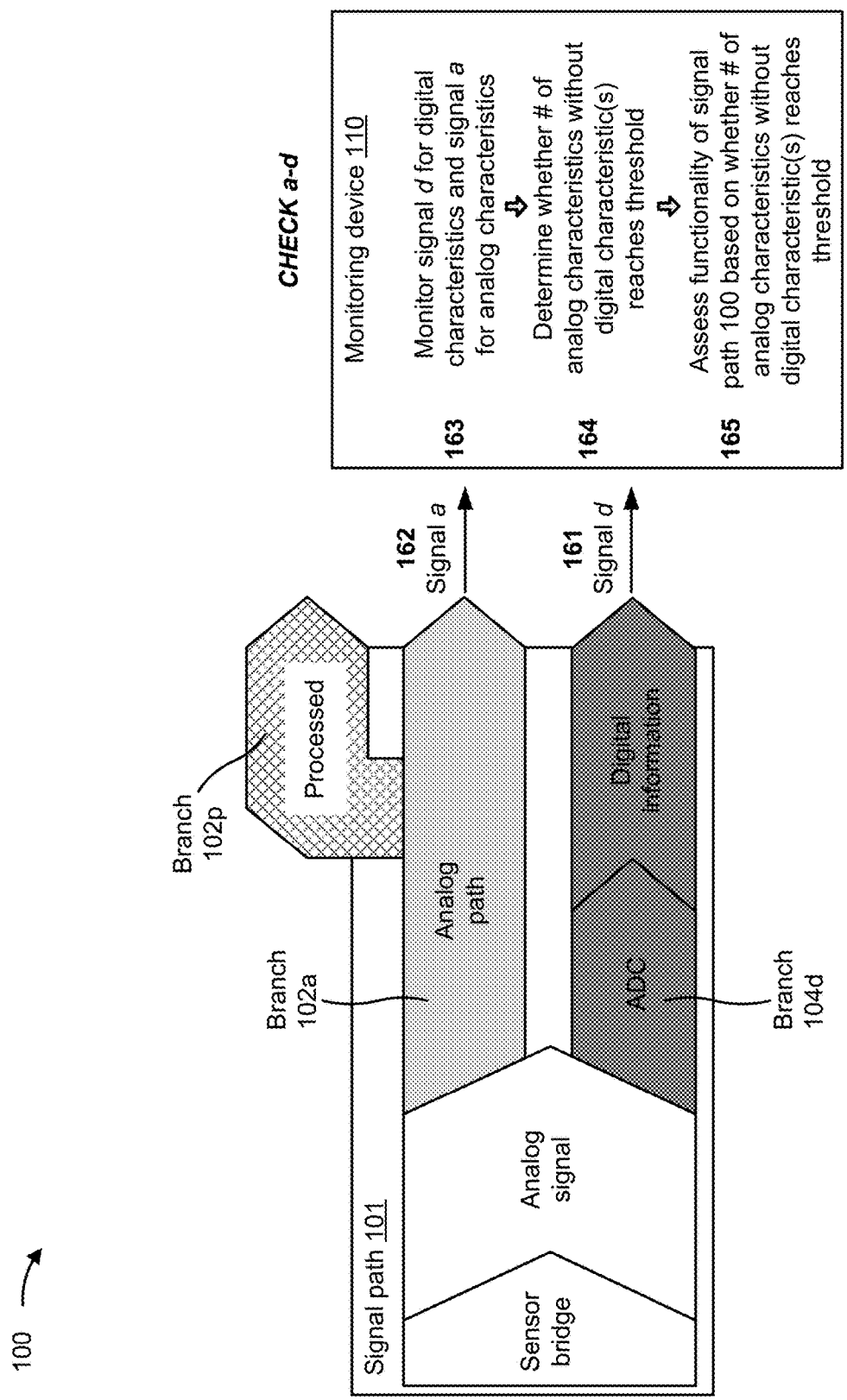

FIGS. 1A and 1B are diagrams illustrating example implementations of robust signal path plausibility checking for functional safety of a sensor. In FIGS. 1A and 1B, a sensor 100 (e.g., a magnetic sensor) includes a signal path 101 and a monitoring device 110. In some implementations, the sensor 100 may be, for example, a speed sensor that is to output a speed signal (e.g., a signal indicative of a rotational speed of a target wheel) and/or a direction signal (e.g., a signal indicative of a rotational direction of the target wheel). Thus, the signal path 101 may be a speed path of the sensor 100, a direction path of the sensor 100, or another type of signal path of the sensor 100. The monitoring device 110 is a device of the sensor 100 that is to assess functionality of the signal path 101, as described herein.

As indicated in FIGS. 1A and 1B, the signal path 101 is defined by a signal processing flow associated with generating and providing an output signal by the sensor 100. As shown in FIGS. 1A and 1B, the signal path 101 may include a sensor bridge portion and an analog signal portion. The sensor bridge portion is a portion of the signal path 101 associated with sensing a magnetic field impinging on one or more sensing elements (e.g., one or more sensing elements 310 of a magnetic sensor 215, as described below with respect to FIGS. 3 and 2, respectively). The analog signal portion includes a portion of the signal path 101 associated with generating and processing an analog signal in response to the magnetic field impinging on the one or more sensing elements of the sensor bridge portion. As shown, after the analog signal portion, the signal path 101 may include two or more branches. That is, the signal path 101 may split into two or more signal path branches. For example, as shown in FIGS. 1A and 1B, the signal path 101 may include a branch 102a, a branch 102p, and a branch 104d.

In the signal path 101, the branch 102a is an analog signal path. That is, the branch 102a is a branch of the signal path 101 that provides an analog signal (e.g., the analog signal generated by the analog signal portion of the signal path 101). In some implementations, the analog path is a low jitter portion of the signal path 101 (e.g., since the analog signal does not include noise that is generated by digitalization of the analog signal). A signal on or provided by the branch 102a is herein referred to as analog signal a.

In the signal path 101, the branch 102p is a processed signal path. That is, the branch 102p is a branch of the signal path 101 that provides a processed signal In some implementations, the processed signal is a processed version of the analog signal generated by the analog signal portion of the signal path 101 (as shown in sensor 100). In some implementations, the processed signal is a processed version of the digital signal generated by the digital signal portion of the signal path 101. In some implementations, the processing of the signal performed on the branch 102p results in a delay to the signal on the branch 102p. Thus, when the processed signal is a process analog signal, the signal on the branch 102p may be delayed (or otherwise processed) as compared to the analog signal on the branch 102a. Similarly, when the processed signal is a processed digital signal, the signal on the branch 102p may be delayed (or otherwise processed) as compared to the digital signal on the branch 102d. In some implementations, an amount of delay imparted by the branch 102p may be predetermined (i.e., the delay imparted by the branch 102p can be selected by design of the branch 102p). The processed signal may be produced by, for example, applying a delay to the analog signal or to the digital signal, applying a filter to the analog signal or to the digital signal, amplifying the analog signal or the digital signal, and/or otherwise processing the analog signal or the digital signal. In some implementations, as shown, the branch 102p may originate from a point on the analog signal path along the branch 102a. In some implementations, the branch 102p may originate from a point on the digital signal path along the branch 102d. A signal on or provided by the branch 102p is herein referred to as a processed signal p.

In the signal path 101, the branch 104d is a digital signal path. That is, the branch 104d is a branch of the signal path 101 that provides a digital signal (e.g., a signal that is a digital representation of the analog signal generated by the analog signal portion of the signal path 101). As shown, the branch 104d may include an analog-to-digital (ADC) portion (e.g., a portion at which analog-to-digital conversion is performed) and a digital information portion (e.g., a portion at which digital signal processing is performed). In some implementations, the branch 104d is a branch associated with providing a digitally sampled signal that can be used, for example, for amplitude evaluation, offset evaluation, zero crossing evaluation, and/or the like. A signal on or provided by the branch 104d is herein referred to as digital signal d.

In some implementations, the monitoring device 110 may use signals obtained on two different branches of the signal path 101 (e.g., at two different points in the signal path 101, such as a point on branch 102a and a point on 102d, a point on branch 102a and a point on branch 102p, or a point on branch 102d and a point on branch 120p) to assess functionality of the signal path 101. For example, monitoring device 110 may obtain a first signal at a point on the first branch of the signal path 101 and may obtain a second signal at a point on the second branch of the signal path 101. The monitoring device 110 may monitor the first signal for first characteristics indicated by the first signal and may monitor the second signal for second characteristics indicated by the second signal. The monitoring device 110 may determine, based on the monitoring of the first signal for first characteristics and the monitoring of the second signal for second characteristics, whether a quantity of first characteristics indicated by the first signal without a particular quantity of second characteristics (e.g., one or more second characteristics) being indicated by the second signal reaches a threshold quantity of first characteristics. The monitoring device 110 may then assess functionality of the signal path 101 based on whether the quantity of first characteristics indicated by the first signal without particular quantity of a second characteristics being indicated by the second signal reaches the threshold quantity of first characteristics. As described below, the manner in which the monitoring device 110 assesses functionality of the signal path 101 is robust to vibration and abrupt changes in rotational direction of a target wheel associated with the sensor 100. Particular examples of such functionality assessments are described below.

In some implementations, the monitoring device 110 assesses the functionality of the signal path 101 based on the digital signal d and the analog signal a. FIG. 1B illustrates a first example of the monitoring device 110 assessing functionality of the signal path 101 based on the digital signal d and the analog signal a. As shown by reference 151, the monitoring device 110 may obtain the digital signal d (e.g., from a point on the branch 104d of the signal path 101) and, as shown by reference 152, the magnetic sensor may obtain the analog signal a (e.g., from a point on the branch 102a of the signal path 101).

As shown by reference 153, in the first example of assessing functionality of the signal path 101, the monitoring device 110 monitors the digital signal d for digital characteristics and monitors the analog signal a for analog characteristics.

A digital characteristic is a characteristic indicated by the digital signal d. For example, the digital characteristic may be a threshold crossing (e.g., a zero crossing) of the digital signal d. As another example, the digital characteristic may be an event (e.g., a switching event) associated with the digital signal. In some implementations, the monitoring device 110 may monitor the digital signal d for digital characteristics using a digital comparator of the sensor 100 (e.g., a comparator in the digital domain of the sensor 100). For example, in operation, the digital comparator may switch an output voltage of the digital comparator at each zero crossing of the digital signal d. That is, the digital comparator may switch the output voltage from a first level to a second level at a first zero crossing of the digital signal d, then switch the output voltage from the second level back to the first level at a second zero crossing, then switch the output voltage from the first level back to the second level at a third zero crossing, and so on. In some implementations, the digital comparator may utilize a so-called hidden hysteresis technique. According to the hidden hysteresis technique, the digital signal d crossing a first hysteresis level (e.g., a lower voltage level) or a second hysteresis level (e.g., a higher voltage level) arms the digital comparator to switch the output voltage at a next zero crossing. Further, according to the hidden hysteresis technique, if the digital signal d crosses one of the hysteresis levels such that the digital comparator is armed to switch the output voltage at a next zero crossing, and the digital signal d crosses the same hysteresis level (e.g., without crossing the other hysteresis level, as expected after the next zero crossing), then the second crossing of the hysteresis level triggers the digital comparator to switch the output level. In some implementations, the hidden hysteresis levels are fixed (e.g., not adapted). In some implementations, the use of the hidden hysteresis technique reduces a likelihood of a pulse being missed in the digital signal d.

In some implementations, the monitoring device 110 may monitor the digital signal d for digital characteristics based on the output of the digital comparator. For example, the monitoring device 110 may identify each change in voltage level of the output of the digital comparator as a digital characteristic. In some implementations, the monitoring device 110 may maintain a count of a number of digital characteristics indicated by the digital signal d in association with monitoring the digital signal d for digital characteristics.

An analog characteristic is a characteristic indicated by the analog signal a. For example, the analog characteristic may be a threshold crossing (e.g., a hysteresis crossing) of the analog signal a. As another example, the analog characteristic may be an event (e.g., a switching event) associated with the analog signal. In some implementations, the monitoring device 110 may monitor the analog signal a for analog characteristics using an analog comparator of the sensor 100 (e.g., a comparator in the analog domain of the sensor 100). For example, in operation, the analog comparator may switch an output voltage of the analog comparator at each downward sloped crossing of the analog signal a of a lower hysteresis level and at each upward sloped crossing of the analog signal a at an upper hysteresis level. That is, the analog comparator may switch the output voltage from a first level to a second level at a first downward sloped crossing of a lower hysteresis level by the analog signal a, then switch the output voltage from the second level back to the first level at a first upward sloped crossing of an upper hysteresis level by the analog signal a, then switch the output voltage from the first level back to the second level at a second downward sloped crossing of a lower hysteresis level by the analog signal a, and so on. In some implementations, the analog comparator may utilize a so-called visible hysteresis technique. In some implementations, the lower and upper hysteresis levels used in the visible hysteresis technique can be adapted based on extrema (e.g., a maximum and a minimum) of the analog signal a. For example, the hysteresis levels may be adapted such that the lower and upper hysteresis levels are 50% of a difference between the extrema of the analog signal a.

In some implementations, the monitoring device 110 may monitor the analog signal a for analog characteristics based on the output of the analog comparator. For example, the monitoring device 110 may identify each change in voltage level of the output of the analog comparator as an analog characteristic. In some implementations, the monitoring device 110 may maintain a count of a number of analog characteristics indicated by the analog signal a in association with monitoring the analog signal a for analog characteristics.

As shown by reference 154, a next operation in the first example of assessing functionality of the signal path 101 includes determining whether a quantity of digital characteristics indicated by the digital signal d without a particular quantity of analog characteristics (e.g., one or more analog characteristics) being indicated by the analog signal a reaches a threshold quantity of digital characteristics. For example, the monitoring device 110 may, based on the monitoring of the digital signal d for digital characteristics and the monitoring of the analog signal a, determine whether a quantity of digital characteristics indicated by the digital signal d without a particular quantity of analog characteristics being indicated by the analog signal a reaches a threshold quantity of digital characteristics.

The threshold quantity of digital characteristics may indicate, for example, a maximum number of digital characteristics that can occur without detection of a particular quantity of analog characteristics. As a particular example, the threshold quantity of digital characteristics may indicate that a maximum of fifteen digital characteristics can be indicated by the digital signal d without an analog characteristic being indicated by the analog signal a. In some implementations, the threshold quantity of digital characteristics is selected so as to provide robustness of the first example functionality assessment to false positive error detection. For example, in the presence of a vibration or an abrupt change in a rotational direction of the target wheel, a period of time may be needed to allow one or more parameters (e.g., an offset, a hysteresis level, and/or the like) of the analog signal a and/or the digital signal d to be adjusted to ensure accurate operation of the analog comparator and the digital comparator, respectively (e.g., such that no pulses are missed). Here, the threshold quantity of digital characteristics may be selected so as to permit one or more parameters of the analog signal a to be adjusted before a failure indication associated with the analog signal a is triggered.

As shown by reference 155, a next operation in the first example of assessing functionality of the signal path 101 includes assessing the functionality of the signal path 101 based on whether the quantity of digital characteristics indicated by the digital signal d without a particular quantity of analog characteristics being indicated by the analog signal a reaches the threshold quantity of digital characteristics. Here, if the number of digital characteristics without a particular quantity of analog characteristics reaches the threshold quantity of digital characteristics (e.g., if 15 digital characteristics are detected without one analog characteristic being detected), then the monitoring device 110 may determine that the signal path 101 has failed the first example functionality assessment (e.g., that there is an error on a portion of the signal path 101 associated with the analog signal a). Conversely, if the number of digital characteristics without a particular quantity of analog characteristics does not reach the threshold quantity of digital characteristics (e.g., if fewer than 15 digital characteristics are detected without one analog characteristic being detected), then the monitoring device 110 may determine that the signal path 101 has passed the first example functionality assessment. The monitoring device 110 may continue to (e.g., periodically) perform the first example functionality assessment in the manner described above.

FIG. 1B illustrates a second example of the monitoring device 110 assessing functionality of the signal path 101 based on the digital signal d and the analog signal a. As shown by reference 161, the monitoring device 110 may obtain the digital signal d (e.g., from a point on the branch 104d of the signal path 101) and, as shown by reference 162, the magnetic sensor may obtain the analog signal a (e.g., from a point on the branch 102a of the signal path 101).

As shown by reference 163, in the second example of assessing functionality of the signal path 101, the monitoring device 110 monitors the digital signal d for digital characteristics and monitors the analog signal a for analog characteristics. In some implementations, the monitoring device 110 may monitor the digital signal d for digital characteristics and may monitor the analog signal a for analog characteristics in the manner described above in association with the first example functionality check.

As shown by reference 164, a next operation in the second example of assessing functionality of the signal path 101 includes determining whether a quantity of analog characteristics indicated by the analog signal a without a particular quantity of digital characteristics (e.g., one or more digital characteristics) being indicated by the digital signal d reaches an threshold quantity of analog characteristics. For example, the monitoring device 110 may, based on the monitoring of the digital signal d for digital characteristics and the monitoring of the analog signal a, determine whether a quantity of analog characteristics indicated by the analog signal a without a particular quantity of digital characteristics being indicated by the digital signal d reaches an threshold quantity of analog characteristics.

The threshold quantity of analog characteristics may indicate, for example, a maximum number of analog characteristics that can occur without detection of a particular quantity of digital characteristics. As a particular example, the threshold quantity of analog characteristics may indicate that a maximum of six analog characteristics can be indicated by the analog signal a without one digital characteristic being indicated by the digital signal d. In some implementations, the threshold quantity of analog characteristics is selected so as to provide robustness of the second example functionality assessment to false positive error detection. For example, in the presence of a vibration or an abrupt change in a rotational direction of the target wheel, a period of time may be needed to allow one or more parameters (e.g., an offset, a hysteresis level, and/or the like) of the analog signal a and/or the digital signal d to be adjusted to ensure accurate operation of the analog comparator and the digital comparator, respectively (e.g., such that no pulses are missed). Here, the threshold quantity of analog characteristics may be selected so as to permit one or more parameters of the digital signal d to be adjusted before a failure indication associated with the digital signal d is triggered.

As shown by reference 165, a next operation in the second example of assessing functionality of the signal path 101 includes assessing the functionality of the signal path 101 based on whether the quantity of analog characteristics indicated by the analog signal a without a particular quantity of digital characteristics being indicated by the digital signal d reaches the threshold quantity of analog characteristics. Here, if the number of analog characteristics without a particular quantity of digital characteristics reaches the threshold quantity of analog characteristics (e.g., if six analog characteristics are detected without one digital characteristic being detected), then the monitoring device 110 may determine that the signal path 101 has failed the second example functionality assessment (e.g., that there is an error on a portion of the signal path 101 associated with the digital signal d). Conversely, if the number of analog characteristics without a particular quantity of digital characteristics does not reach the threshold quantity of analog characteristics (e.g., if fewer than six analog characteristics are detected before a digital characteristic is detected), then the monitoring device 110 may determine that the signal path 101 has passed the second example functionality assessment. The monitoring device 110 may continue to (e.g., periodically) perform the second example functionality assessment in the manner described above.

In some implementations, the monitoring device 110 assess the functionality of the signal path 101 based on the analog signal a and the processed signal p in the form of a processed version of the analog signal a. A third example of the monitoring device 110 assessing functionality of the signal path 101 based on the analog signal a and the processed signal p is described as follows. In an example, the monitoring device 110 may obtain the analog signal a (e.g., on the branch 102a of the signal path 101) and may obtain the processed signal p (e.g., on the branch 102p of the signal path 101). Here, the monitoring device 110 may identify an analog characteristic indicated by the analog signal a (e.g., in the manner described above). Next the monitoring device 110 may determine whether a next characteristic after the analog characteristic indicated by the analog signal a is a characteristic that is indicated by the analog signal a or is a characteristic that is indicated by the processed signal p. That is, the monitoring device 110 determines whether a next characteristic (in the time domain) detected is a characteristic indicated by the analog signal a or is a characteristic detected by the processed signal p. The monitoring device 110 then assesses functionality of the signal path 101 based on whether the next characteristic is a characteristic that is indicated by the analog signal a or is a characteristic that is indicated by the processed signal p. Here, because the processed signal p is delayed with respect to the analog signal a, characteristics on the two signals are expected to alternate between the analog signal a and the processed signal p. Therefore, if two characteristics are detected on the analog signal a consecutively (i.e., without a characteristic on the processed signal p being detected between the two characteristics on the analog signal a), then there may be a fault on the signal path 101. Thus, if the monitoring device 110 determines that a next characteristic after a characteristic on the analog signal a is a characteristic that is indicated by the analog signal a, then the monitoring device 110 may determine that the signal path 101 has failed the functionality assessment. Conversely, if the monitoring device 110 determines that a next characteristic after a characteristic on the analog signal a is a characteristic that is indicated by the processed signal p, then the monitoring device 110 may determine that the signal path 101 has passed the third functionality assessment. The monitoring device 110 may continue to (e.g., periodically) perform the third example functionality assessment in the manner described above.

In some implementations, the monitoring device 110 assess the functionality of the signal path 101 based on the digital signal d and the processed signal p in the form of a processed version of the digital signal d. A fourth example of the monitoring device 110 assessing functionality of the signal path 101 based on the digital signal d and the processed signal p is described as follows. In an example, the monitoring device 110 may obtain the digital signal d (e.g., on the branch 102d of the signal path 101) and may obtain the processed signal p (e.g., on the branch 102p of the signal path 101). Here, the monitoring device 110 may identify a digital characteristic indicated by the digital signal d (e.g., in the manner described above). Next the monitoring device 110 may determine whether a next characteristic after the digital characteristic indicated by the digital signal d is a characteristic that is indicated by the digital signal d or is a characteristic that is indicated by the processed signal p. That is, the monitoring device 110 determines whether a next characteristic (in the time domain) detected is a characteristic indicated by the digital signal d or is a characteristic detected by the processed signal p. The monitoring device 110 then assesses functionality of the signal path 101 based on whether the next characteristic is a characteristic that is indicated by the digital signal d or is a characteristic that is indicated by the processed signal p. Here, because the processed signal p is delayed with respect to the digital signal d, characteristics on the two signals are expected to alternate between the digital signal d and the processed signal p. Therefore, if two characteristics are detected on the digital signal d consecutively (i.e., without a characteristic on the processed signal p being detected between the two characteristics on the digital signal d), then there may be a fault on the signal path 101. Thus, if the monitoring device 110 determines that a next characteristic after a characteristic on the digital signal d is a characteristic that is indicated by the digital signal d, then the monitoring device 110 may determine that the signal path 101 has failed the functionality assessment. Conversely, if the monitoring device 110 determines that a next characteristic after a characteristic on the digital signal d is a characteristic that is indicated by the processed signal p, then the monitoring device 110 may determine that the signal path 101 has passed the fourth functionality assessment. The monitoring device 110 may continue to (e.g., periodically) perform the fourth example functionality assessment in the manner described above.

In some implementations, performance of a given functionality check may be triggered based on, for example, a timer, a communication from another device (e.g., an ECU), and/or the like. In some implementations, the magnetic sensor may perform one or more of the functionality checks described above. For example, the magnetic sensor may perform each of the three functionality checks described above. In some implementations, an order in which the magnetic sensor performs two or more functionality checks may be predefined, randomized, priority-based, rotated, and/or the like.

In some implementations, when the monitoring device 110 determines that the signal path 101 has failed a functionality assessment (e.g., when a result of the functionality assessment indicates there is an error associated with the signal path 101), the monitoring device 110 may signal (e.g., to an ECU or to another device) an error associated with the signal path 101. In some implementations, the monitoring device 110 may provide an indication of a result of one or more functionality assessments associated with the signal path 101. For example, the monitoring device 110 may provide (e.g., to an ECU or to another device) an indication of whether the signal path 101 has passed or failed one or more functionality assessments. In some implementations, the indication may include information that identifies the functionality assessment passed or failed by the signal path 101 and/or information that indicates a portion of the signal path 101 on which the error has been detected. In some implementations, the indication may include another type of information, such as information indicating a number of characteristics indicated by one or more signals associated with the functionality check, a degree to which the signal path 101 passed or failed the functionality check, or another type of information.

In some implementations, the monitoring device 110 may provide an indication (e.g., signal an error of the signal path 101) only if one or more conditions are satisfied. That is, in some implementations, the monitoring device 110 may suppress (e.g., refrain from providing) an indication when one or more conditions are not satisfied.

In some implementations, the one or more conditions may include a determination that that a vibration of the sensor 100 does not exceed a vibration threshold. For example, the monitoring device 110 may include one or more components configured to detect whether a vibration of the sensor 100 exceeds a vibration threshold (e.g., a threshold above which operation of the sensor 100 could be adversely impacted). Here, if the monitoring device 110 determines that a vibration of the sensor 100 does not exceed the vibration threshold, then the monitoring device 110 may provide the indication (e.g., such that the monitoring device 110 signals a detected error). Conversely, if the monitoring device 110 determines that a vibration of the sensor 100 exceeds the vibration threshold, then the monitoring device 110 may suppress the indication (e.g., such that the monitoring device 110 does not signal a detected error) and instead may signal that a vibration has been detected. In this way, the monitoring device 110 may be configured with an exemption to account for detection of a vibration of the sensor 100. In some implementations, the monitoring device 110 may refrain from performing any functionality assessments and/or ignore results of any functionality assessments during the vibration.

As another example, the monitoring device 110 may include one or more components configured to detect when an air gap in the sensor 100 exceeds an allowable air gap. Here, if the monitoring device 110 determines that the air gap does not exceed the allowable air gap limit, then the monitoring device 110 may provide the indication (e.g., such that the monitoring device 110 signals a detected error). Conversely, if the monitoring device 110 determines that the air gap exceeds the allowable air gap limit, then the monitoring device 110 may suppress the indication (e.g., such that the monitoring device 110 does not signal a detected error).

As another example, the monitoring device 110 may include one or more components configured to detect when an offset to be applied on the signal path 101 is outside of (e.g., above or below) an allowable offset range. Here, if the monitoring device 110 determines that the offset is not outside of the allowable offset range, then the monitoring device 110 may provide the indication. Conversely, if the monitoring device 110 determines that the offset is outside of the allowable offset range, then the monitoring device 110 may suppress the indication.

In some implementations, requiring the one or more conditions to be satisfied prevents the monitoring device 110 from indicating an error detected by one or more of the functionality assessments when in fact the signal path 101 may not actually be experiencing an error. That is, the one or more conditions may prevent an error associated with the signal path 101 from being indicated when in fact there may be no error or there may be another type of error associated with the sensor (e.g., a system-level error rather than an error on the signal path 101).

As indicated above, FIGS. 1A and 1B are provided as an example. Other examples may differ from what is described with regard to FIGS. 1A and 1B. The number and arrangement of components shown in FIGS. 1A and 1B are provided as an example. In practice, there may be additional components, fewer components, different components, or differently arranged components than those shown in FIGS. 1A and 1B. Furthermore, two or more components shown in FIGS. 1A and 1B may be implemented within a single component, or a single component shown in FIGS. 1A and 1B may be implemented as multiple, distributed components. Additionally, or alternatively, a set of components (e.g., one or more components) shown in FIGS. 1A and 1B may perform one or more functions described as being performed by another set of components shown in FIGS. 1A and 1B.

Figure 2A:
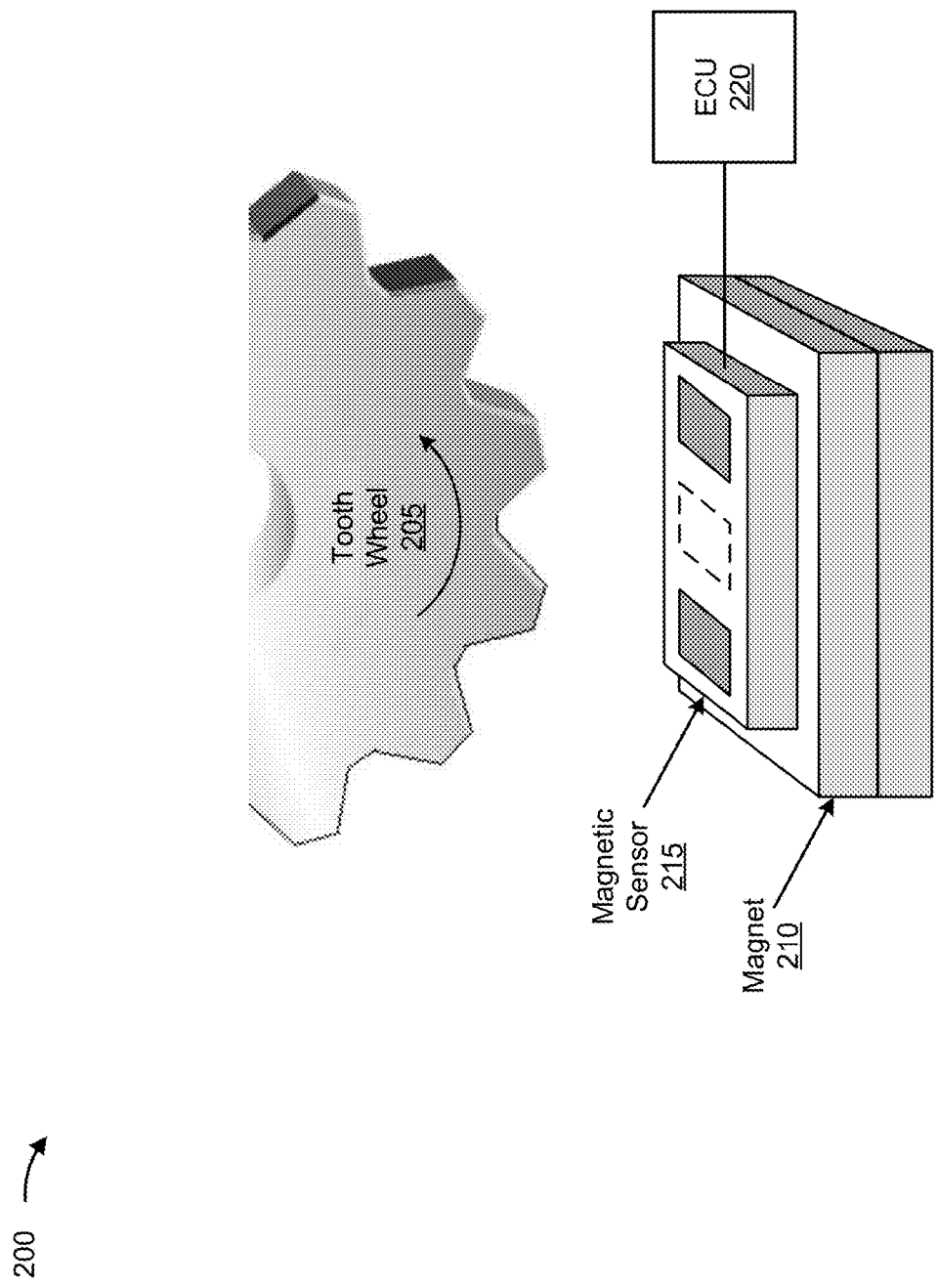
FIGS. 2A and 2B are diagrams of example environments in which systems and/or methods described herein may be implemented.
Figure 2B:
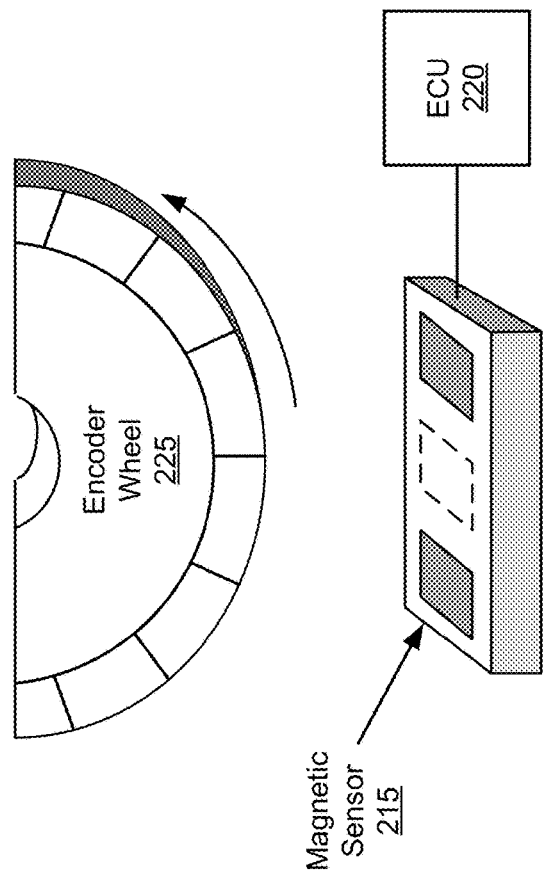

FIGS. 2A and 2B are diagrams of example environments 200 and 250 in systems and/or methods described herein may be implemented. As shown in FIG. 2A, environment 200 may include a tooth wheel 205, a magnet 210, a magnetic sensor 215, and an ECU 220.

Tooth wheel 205 includes a wheel comprising a set of teeth. In some implementations, tooth wheel 205 may, during a rotation, distort a magnetic field of a magnet 210 such that magnetic sensor 215 may sense the distorted magnetic field associated with magnet 210. In some implementations, tooth wheel 205 may be comprised of a ferromagnetic material. In some implementations, tooth wheel 205 may be attached to or coupled with an object for which a rotational speed, a rotational direction, and/or an angular position is to be measured, such as a cylindrical structure (e.g., a crankshaft, a camshaft, a rotating cylinder, a transmission shaft, and/or the like), a wheel structure (e.g., associated with a tire), an axle (e.g., a vehicle axle), and/or the like.

In some implementations, such as in a crankshaft context, tooth wheel 205 may include a symmetrical tooth wheel, where teeth of tooth wheel 205 have a same width and tooth gaps of tooth wheel 205 have a same width. In some implementations, tooth wheel 205 may include a reference zone (e.g., a comparatively longer tooth or gap) between a pair of teeth of tooth wheel 205. In some implementations, such as in a camshaft context, tooth wheel 205 may include an asymmetrical tooth wheel, where teeth of tooth wheel 205 have varying widths and/or tooth gaps of tooth wheel 205 have varying widths.

Magnet 210 includes a magnet that produces a magnetic field that may be sensed by magnetic sensor 215. In some implementations, magnet 210 may be positioned such that the magnetic field, produced by magnet 210, is distorted by tooth wheel 205. Additionally, or alternatively, magnet 210 may include a back-bias magnet and/or may be positioned near, included in, and/or attached to magnetic sensor 215.

Magnetic sensor 215 includes a module including one or more components (also referred to herein as "sensor components") of a sensor, such as a magnetoresistive (MR) sensor, a Hall-effect sensor, a variable reluctance sensor (VRS), a fluxgate sensor, and/or the like. In some implementations, the magnetic sensor 215 may include the signal path 101 and may include the monitoring device 110 capable of performing one or more functionality assessments associated with the signal path 101, as described herein. In some implementations, magnetic sensor 215 may be connected to ECU 220 such that magnetic sensor 215 may transmit information associated with a magnet wheel (e.g., tooth wheel 205, encoder wheel 225) and/or information associated with a sensor system (e.g., a magnetic circuit including tooth wheel 205, magnet 210, and magnetic sensor 215) to ECU 220. The information associated with the magnet wheel may include, for example, information associated with a rotational speed of the magnet wheel, a rotational direction of the magnet wheel, an angular position of the magnet wheel, and/or the like. In some implementations, magnetic sensor 215 may provide such information to ECU 220 via one or more transmission interfaces (e.g., a voltage interface, a current interface, etc.) and/or via one or more output terminals. In some implementations, magnetic sensor 215 may include a three-wire sensor (e.g., including one output terminal), a four-wire sensor (e.g., including two output terminals), and/or the like. Additional details regarding magnetic sensor 215 are described below with regard to FIG. 3.

ECU 220 includes one or more circuits associated with determining a rotational speed and/or direction of a magnet wheel (i.e., a rotatable object that is connected to tooth wheel 205 or encoder wheel 225), determining information associated with an error associated with the sensor system, and/or providing such information in association with controlling one or more electrical systems and/or electrical subsystems. In some implementations, ECU 220 may be connected to magnetic sensor 215 such that ECU 220 may receive information (e.g., one or more signals) from magnetic sensor 215 via one or more transmission interfaces and/or via one or more output terminals.

In some implementations, ECU 220 may be capable of calibrating, controlling, adjusting, and/or the like, the one or more electrical systems and/or electrical subsystems based on the information transmitted by magnetic sensor 215. In some implementations, ECU 220 may include an electronic/engine control module (ECM), a powertrain control module (PCM), a transmission control module (TCM), a brake control module (BCM or EBCM), a central control module (CCM), a central timing module (CTM), a general electronic module (GEM), a body control module (BCM), a suspension control module (SCM), and/or the like.

As shown in FIG. 2B, example environment 250 may include magnetic sensor 215, ECU 220, and encoder wheel 225 (e.g., rather than tooth wheel 205 and magnet 210). Encoder wheel 225 includes a magnetic pole wheel with at least two alternating poles, such as a north pole and a south pole. In some implementations, encoder wheel 225 may include a reference zone (e.g., a section with a comparatively longer pole). In some implementations, encoder wheel 225 may produce a magnetic field. In some implementations, encoder wheel 225 may be attached to or coupled with an object for which a rotational speed, a rotational direction, and/or a position is to be measured, such as a cylindrical structure (e.g., a crankshaft, a camshaft, a rotating cylinder, and/or the like), a wheel structure (e.g., associated with a tire), an axle (e.g., a vehicle axle), and/or the like. In some implementations, encoder wheel 225 and/or tooth wheel 205 may be referred to as a "target wheel."

The number and arrangement of apparatuses shown in FIGS. 2A and 2B are provided as an example. In practice, there may be additional apparatuses, fewer apparatuses, different apparatuses, or differently arranged apparatuses than those shown in FIGS. 2A and 2B. For example, while FIGS. 2A and 2B show particular arrangements of apparatuses in example environments 200 and 250, respectively, in some implementations, magnet 210 and/or magnetic sensor 215 may arranged in a so-called "top read" arrangement, wherein magnet 210 and/or magnetic sensor 215 are positioned above tooth wheel 205/encoder wheel 225 (e.g., rather than below tooth wheel 205/encoder wheel 225 as shown in FIGS. 2A and 2B). Furthermore, two or more apparatuses shown in FIGS. 2A and/or 2B may be implemented within a single apparatus, or a single apparatus shown in FIGS. 2A and/or 2B may be implemented as multiple, distributed apparatuses. Additionally, or alternatively, a set of apparatuses (e.g., one or more apparatuses) of FIGS. 2A and/or 2B may perform one or more functions described as being performed by another set of apparatuses of FIGS. 2A and/or 2B.

Figure 3:
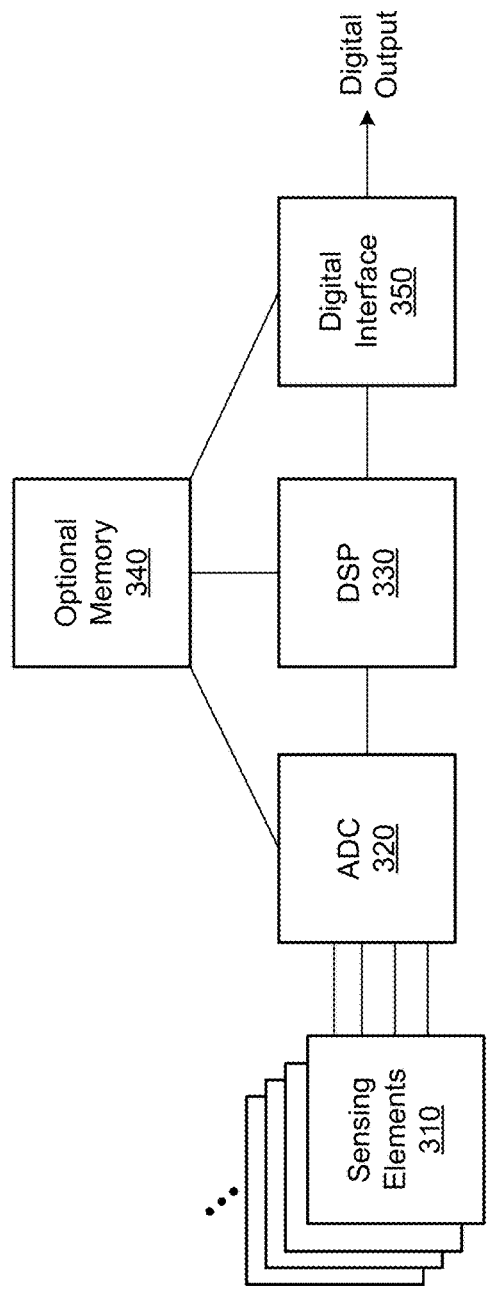
FIG. 3 is a diagram of example elements of a sensor included in an example environment of FIG. 2A or 2B.

FIG. 3 is a diagram of example elements of magnetic sensor 215 included in example environment 200 of FIG. 2A and/or example environment 250 of FIG. 2B. As shown, magnetic sensor 215 may include at least one sensing element 310, an ADC 320, a digital signal processor (DSP) 330, an optional memory element 340, and a digital interface 350.

Sensing element 310 includes an element for sensing a magnetic field at magnetic sensor 215. For example, sensing element 310 may include a magnetoresistive (MR)-based sensing element, elements of which are comprised of a magnetoresistive material (e.g., nickel-iron (NiFe)), where the electrical resistance of the magnetoresistive material may depend on a strength and/or a direction of the magnetic field present at the magnetoresistive material. Here, sensing element 310 may operate based on an anisotropic magnetoresistance (AMR) effect, a giant magnetoresistance (GMR) effect, a tunnel magnetoresistance (TMR) effect, and/or the like. As another example, sensing element 310 may include a Hall-based sensing element that operates based on a Hall-effect. As an additional example, sensing element 310 may include a variable reluctance (VR) based sensing element that operates based on induction. In some implementations, sensing element 310 may provide an analog signal, corresponding to the magnetic field, to ADC 320.

ADC 320 includes an analog-to-digital converter that converts an analog signal from the sensing element 310 to a digital signal. For example, ADC 320 may convert analog signals, received from the set of sensing elements 310 and/or physical parameter sensor 315, into digital signals to be processed by DSP 330. ADC 320 may provide the digital signals to DSP 330. In some implementations, magnetic sensor 215 may include one or more ADCs 320.

DSP 330 includes a digital signal processing device or a collection of digital signal processing devices. In some implementations, DSP 330 may receive digital signals from ADC 320 and may process the digital signals to form signals (e.g., destined for ECU 220 as shown in FIGS. 2A and 2B), such as signals associated with a rotational speed of tooth wheel 205/encoder wheel 225 and/or a rotational direction of tooth wheel 205/encoder wheel 225. In some implementations, the monitoring device 110 described herein may be configured on DSP 330 and/or on another component of the magnetic sensor 215.

Optional memory element 340 includes a read only memory (ROM) (e.g., an EEPROM), a random access memory (RAM), and/or another type of dynamic or static storage device (e.g., a flash memory, a magnetic memory, an optical memory, and/or the like) that stores information and/or instructions for use by magnetic sensor 215. In some implementations, optional memory element 340 may store information associated with processing performed by DSP 330. Additionally, or alternatively, optional memory element 340 may store configurational values or parameters for the set of sensing elements 310, physical parameter sensor 315, and/or information for one or more other elements of magnetic sensor 215, such as ADC 320 or digital interface 350.

Digital interface 350 includes an interface via which magnetic sensor 215 may receive and/or provide information from and/or to another device, such as ECU 220 (see FIGS. 2A and 2B). For example, digital interface 350 may provide a signal (i.e., an output signal), determined by DSP 330, to ECU 220 and may further receive information from ECU 220. In some implementations, digital interface 350 permits magnetic sensor 215 to provide one or more signals to ECU 220, as described elsewhere herein.

The number and arrangement of elements shown in FIG. 3 are provided as an example. In practice, magnetic sensor 215 may include additional elements, fewer elements, different elements, or differently arranged elements than those shown in FIG. 3. For example, magnetic sensor 215 includes an analog signal processing device or a collection of analog signal processing devices (e.g., to receive analog signals from sensing elements 310 and process the analog signals, an analog current interface at which an output can be stopped or suppressed by control in DSP 330, or the like. Additionally, or alternatively, a set of elements (e.g., one or more elements) of magnetic sensor 215 may perform one or more functions described as being performed by another set of elements of magnetic sensor 215.

Figure 4:
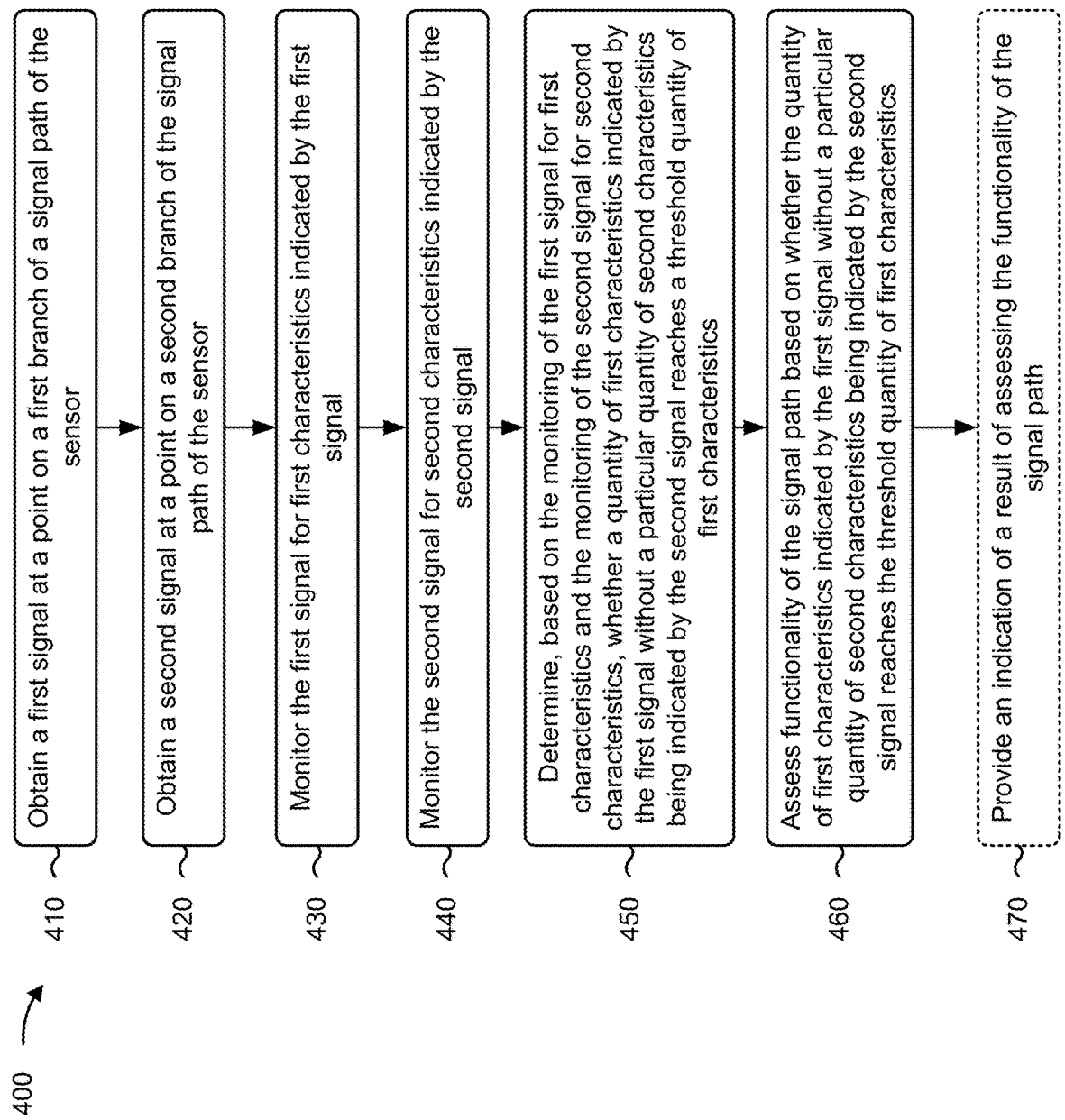
FIG. 4 is a flow chart of an example process relating to robust signal path plausibility checking for functional safety of a sensor, as described herein.

FIG. 4 is a flowchart of an example process 400 relating to robust signal path plausibility checking for functional safety of a sensor, as described herein. In some implementations, one or more process blocks of FIG. 4 may be performed by a monitoring device (e.g., monitoring device 110) included in a sensor (e.g., sensor 100, magnetic sensor 215, and/or the like).

As shown in FIG. 4, process 400 may include obtaining a first signal at a point on a first branch of a signal path of the sensor (block 410). For example, the monitoring device may obtain a first signal at a point on a first branch of a signal path of the sensor, as described above.

As further shown in FIG. 4, process 400 may include obtaining a second signal at a point on a second branch of the signal path of the sensor (block 420). For example, the monitoring device may obtain a second signal at a point on a second branch of the signal path of the sensor, as described above.

As further shown in FIG. 4, process 400 may include monitoring the first signal for first characteristics indicated by the first signal (block 430). For example, the monitoring device may monitor the first signal for first characteristics indicated by the first signal, as described above.

As further shown in FIG. 4, process 400 may include monitoring the second signal for second characteristics indicated by the second signal (block 440). For example, the monitoring device may monitor the second signal for second characteristics indicated by the second signal, as described above.

As further shown in FIG. 4, process 400 may include determining, based on the monitoring of the first signal for first characteristics and the monitoring of the second signal for second characteristics, whether a quantity of first characteristics indicated by the first signal without a particular quantity of second characteristics being indicated by the second signal reaches a threshold quantity of first characteristics (block 450). For example, the monitoring device may determine, based on the monitoring of the first signal for first characteristics and the monitoring of the second signal for second characteristics, whether a quantity of first characteristics indicated by the first signal without a particular quantity of second characteristics (e.g., one or more second characteristics) being indicated by the second signal reaches a threshold quantity of first characteristics, as described above.

As further shown in FIG. 4, process 400 may include assessing functionality of the signal path based on whether the quantity of first characteristics indicated by the first signal without a particular quantity of second characteristics being indicated by the second signal reaches the threshold quantity of first characteristics (block 460). For example, the monitoring device may assess functionality of the signal path based on whether the quantity of first characteristics indicated by the first signal without a particular quantity of second characteristics being indicated by the second signal reaches the threshold quantity of first characteristics, as described above.

As further shown in FIG. 4, process 400 may optionally include providing an indication of a result of assessing the functionality of the signal path 101 (block 470). For example, the monitoring device may provide an indication of a result of assessing the functionality of the signal path, as described above.

Process 400 may include additional implementations, such as any single implementation or any combination of implementations described below and/or in connection with one or more other processes described elsewhere herein.

In a first implementation, process 400 includes determining, based on the monitoring of the first signal for first characteristics and the monitoring of the second signal for second characteristics, whether a quantity of second characteristics indicated by the second signal without a particular quantity of first characteristics (e.g., one or more first characteristics) being indicated by the first signal reaches a threshold quantity of second characteristics, and assessing the functionality of the signal path based on whether the quantity of second characteristics indicated by the second signal without a particular quantity of first characteristics being indicated by the first signal reaches the threshold quantity of second characteristics.

In a second implementation, alone or in combination with the first implementation, the first signal is an analog signal and the second signal is a digital representation of the analog signal.

In a third implementation, alone or in combination with one or more of the first and second implementations, the first signal is a digital representation of an analog signal and the second signal is the analog signal.

In a fourth implementation, alone or in combination with one or more of the first through third implementations, process 400 includes providing an indication of a result of the assessing of the functionality of the signal path.

In a fifth implementation, alone or in combination with one or more of the first through fourth implementations, the indication of the result is provided based on at least one of a determination that a vibration of the sensor does not exceed a vibration threshold, a determination that an air gap in the sensor does not exceed an allowable air gap, or a determination that an offset to be applied on the signal path is not outside of an allowable offset range.

In a sixth implementation, alone or in combination with one or more of the first through fifth implementations, process 400 includes suppressing an indication of a result of the assessing of the functionality of the signal path.

In a seventh implementation, alone or in combination with one or more of the first through sixth implementations, the indication of the result is suppressed based on at least one of a detection of a vibration of the sensor that exceeds a vibration threshold, a determination that an air gap in the sensor exceeds an allowable air gap, or a determination that an offset to be applied on the signal path is outside of an allowable offset range.

In an eighth implementation, alone or in combination with one or more of the first through seventh implementations, process 400 includes signaling an error when a result of the assessing of the functionality of the signal path indicates an error on the signal path.

In a ninth implementation, alone or in combination with one or more of the first through eighth implementations, the sensor is a speed sensor and the signal path is a speed signal path or is a direction signal path.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, and/or a combination of hardware and software.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method, comprising:
    obtaining, by a monitoring device of a sensor, a first signal at a point on a first branch of a signal path of the sensor;
    obtaining, by the monitoring device, a delayed first signal at a point on a branch of the first branch;
    monitoring, by the monitoring device, the first signal for an occurrence of a characteristic indicated by the first signal;
    monitoring, by the monitoring device, the first signal and the delayed first signal to determine whether a next occurrence of the characteristic indicated by the first signal is indicated by the first signal or by the delayed first signal;
    assessing, by the monitoring device, a functionality of the signal path based on whether the next occurrence of the characteristic is indicated by the first signal or by the delayed first signal;
    obtaining, by the monitoring device, a second signal at a point on a second branch of the signal path of the sensor;
    monitoring, by the monitoring device, the first signal for first characteristics indicated by the first signal;
    monitoring, by the monitoring device, the second signal for second characteristics indicated by the second signal;
    determining, by the monitoring device and based on the monitoring of the first signal for the first characteristics and the monitoring of the second signal for the second characteristics, a quantity of first characteristics indicated by the first signal without a corresponding second characteristic being indicated by the second signal;
    determining, by the monitoring device, when the quantity of first characteristics indicated by the first signal without the corresponding second characteristic being indicated by the second signal reaches a threshold quantity of first characteristics; and
    assessing, by the monitoring device, the functionality of the signal path based on whether the quantity of first characteristics indicated by the first signal without a particular quantity of second characteristics being indicated by the second signal reaches the threshold quantity of first characteristics.

2. The method of claim 1, wherein at least one of the characteristic indicated by the first signal, the first characteristics, or the second characteristics is a switching event or a threshold crossing.

3. The method of claim 1, further comprising:
    determining, based on the monitoring of the first signal for the first characteristics and the monitoring of the second signal for the second characteristics, that a quantity of second characteristics indicated by the second signal without a corresponding first characteristic being indicated by the first signal reaches a threshold quantity of second characteristics; and
    assessing the functionality of the signal path based on the quantity of second characteristics indicated by the second signal without the corresponding first characteristic being indicated by the first signal reaching the threshold quantity of second characteristics.

4. The method of claim 1, wherein the first signal is an analog signal and the second signal is a digital representation of the analog signal.

5. The method of claim 1, wherein the first signal is a digital representation of an analog signal and the second signal is the analog signal.

6. The method of claim 1, further comprising providing an indication of a result of the assessing of the functionality of the signal path.

7. The method of claim 6, wherein the indication of the result is provided based on at least one of:
    a determination that a vibration of the sensor does not exceed a vibration threshold,
    a determination that an air gap in the sensor does not exceed an allowable air gap, or
    a determination that an offset to be applied on the signal path is not outside of an allowable offset range.

8. The method of claim 1, further comprising suppressing an indication of a result of the assessing of the functionality of the signal path.

9. The method of claim 8, wherein the indication of the result is suppressed based on at least one of:
a detection of a vibration of the sensor that exceeds a vibration threshold, a determination that an air gap in the sensor exceeds an allowable air gap, or a determination that an offset to be applied on the signal path is outside of an allowable offset range.

10. The method of claim 1, further comprising signaling an error when a result of the assessing of the functionality of the signal path indicates an error on the signal path.

11. The method of claim 1, wherein the sensor is a speed sensor and the signal path is a speed signal path or is a direction signal path.

12. A sensor, comprising:
a signal path including a first branch and a second branch; and
a monitoring device to:
obtain a first signal at a point on the first branch of the signal path;
obtain a delayed first signal at a point on a branch of the first branch;
monitor the first signal for an occurrence of a characteristic indicated by the first signal;
monitor the first signal and the delayed first signal to determine whether a next occurrence of the characteristic indicated by the first signal is indicated by the first signal or by the delayed first signal;
assess a functionality of the signal path based on whether the next occurrence of the characteristic is indicated by the first signal or by the delayed first signal;
obtain a second signal at a point on the second branch of the signal path;
monitor the first signal for first characteristics indicated by the first signal;
monitor the second signal for second characteristics indicated by the second signal;
determine, based on the monitoring of the first signal for the first characteristics and the monitoring of the second signal for the second characteristics, that a quantity of first characteristics indicated by the first signal without a corresponding second characteristic being indicated by the second signal reaches a threshold quantity of first characteristics; and
assess the functionality of the signal path based on the quantity of the first characteristics indicated by the first signal without the corresponding second characteristic being indicated by the second signal reaching the threshold quantity of first characteristics.

13. The sensor of claim 12, wherein the monitoring device is further to:
determine, based on the monitoring of the first signal for the first characteristics and the monitoring of the second signal for the second characteristics, that a quantity of second characteristics indicated by the second signal without a corresponding first characteristic being indicated by the first signal reaches a threshold quantity of second characteristics; and
assess the functionality of the signal path based on the quantity of second characteristics indicated by the second signal without the corresponding first characteristic being indicated by the first signal reaching the threshold quantity of second characteristics.

14. The sensor of claim 12, wherein the first signal is an analog signal and the second signal is a digital representation of the analog signal.

15. The sensor of claim 12, wherein the first signal is a digital representation of an analog signal and the second signal is the analog signal.

16. The sensor of claim 12, wherein the monitoring device is further to provide an indication of a result of the assessing of the functionality of the signal path.

17. The sensor of claim 16, wherein the indication of the result is provided based on at least one of:
a determination that a vibration of the sensor does not exceed a vibration threshold,
a determination that an air gap in the sensor does not exceed an allowable air gap, or
a determination that an offset to be applied on the signal path is not outside of an allowable offset range.

18. The sensor of claim 12, wherein the monitoring device is further to suppress an indication of a result of the assessing of the functionality of the signal path.

19. The sensor of claim 18, wherein the indication of the result is suppressed based on at least one of:
a detection of a vibration of the sensor that exceeds a vibration threshold, a determination that an air gap in the sensor exceeds an allowable air gap, or a determination that an offset to be applied on the signal path is outside of an allowable offset range.

20. A monitoring device, comprising:
one or more components to:
monitor an analog signal for analog characteristics indicated by the analog signal, the analog signal being associated with an analog branch of a signal path of a sensor;
determine an occurrence of an analog characteristic indicated by the analog signal based on monitoring the analog signal for the analog characteristics;
monitor the analog signal and a delayed analog signal to determine whether a next occurrence of the analog characteristic is indicated by the analog signal or the delayed analog signal;
assess a functionality of the signal path based on whether the next occurrence of the analog characteristic is indicated by the analog signal or by the delayed analog signal;
monitor a digital signal for digital characteristics indicated by the digital signal, the digital signal being associated with a digital branch of the signal path of the sensor and being a digital representation of the analog signal; and
assess functionality of the signal path based on the monitoring of the analog signal and the monitoring of the digital signal, the assessing of the functionality being based on at least one of:
a determination of whether a quantity of analog characteristics indicated by the analog signal without a corresponding digital characteristic being indicated by the digital signal reaches a threshold quantity of analog characteristics, or
a determination of whether a quantity of digital characteristics indicated by the digital signal without a corresponding analog characteristic being indicated by the analog signal reaches a threshold quantity of digital characteristics.

* * * * *